United States Patent
Mun et al.

(10) Patent No.: US 10,529,819 B2
(45) Date of Patent: Jan. 7, 2020

(54) HIGH VOLTAGE SCHOTTKY DIODE AND MANUFACTURING METHOD THEREOF

(71) Applicant: GLOBALFOUNDRIES Singapore Pte. Ltd., Singapore (SG)

(72) Inventors: Namchil Mun, Singapore (SG); Shiang Yang Ong, Singapore (SG); Jeoung Mo Koo, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 51 days.

(21) Appl. No.: 15/803,742

(22) Filed: Nov. 4, 2017

(65) Prior Publication Data

US 2019/0140071 A1    May 9, 2019

(51) Int. Cl.
| | |
|---|---|
| *H01L 29/66* | (2006.01) |
| *H01L 29/872* | (2006.01) |
| *H01L 29/06* | (2006.01) |
| *H01L 29/40* | (2006.01) |

(52) U.S. Cl.
CPC .... *H01L 29/66143* (2013.01); *H01L 29/0619* (2013.01); *H01L 29/872* (2013.01); *H01L 29/402* (2013.01)

(58) Field of Classification Search
CPC ........... H01L 29/0619; H01L 29/66143; H01L 29/872; H01L 51/0579
See application file for complete search history.

(56) References Cited

U.S. PATENT DOCUMENTS

| | | | |
|---|---|---|---|
| 2013/0341705 A1* | 12/2013 | Raghavan | H01L 29/1095 257/328 |
| 2014/0179079 A1* | 6/2014 | Huang | H01L 29/66681 438/286 |
| 2015/0325570 A1* | 11/2015 | Chen | H01L 29/41708 257/140 |
| 2017/0257032 A1* | 9/2017 | Wang | H02M 3/1588 |
| 2018/0323315 A1* | 11/2018 | Zhu | H01L 29/872 |
| 2018/0366561 A1* | 12/2018 | Dochev | H01L 29/66659 |

* cited by examiner

*Primary Examiner* — Matthew E. Gordon
(74) *Attorney, Agent, or Firm* — Thompson Hine LLP; Anthony Canale (57) ABSTRACT

The present invention discloses a Schottky diode. The Schottky diode comprises a substrate having a device well. A drift region is disposed within the device well. A guard ring region is disposed within the device well and adjacent to the drift region. A field isolation region and a dielectric film are disposed on a top substrate surface. The dielectric film is aligned to the field isolation region. A field plate is disposed over the field isolation region and the dielectric film. The field plate completely covers a top surface of the dielectric film and partially overlaps the guard ring region. A conductive contact layer is disposed adjacent to the dielectric film. The conductive contact layer contacts a portion of the device well to define a Schottky diode interface.

20 Claims, 10 Drawing Sheets

HIGH VOLTAGE SCHOTTKY DIODE AND MANUFACTURING METHOD THEREOF

FIELD OF THE INVENTION

The present disclosure generally relates to semiconductor devices, and more particularly relates to Schottky diodes.

BACKGROUND

When a metal layer contacts with a lightly doped semiconductor material, a contact effect comparable to a PN-junction diode appears. It is called the Schottky contact. This effect is used to make Schottky diode. When forward biased, a Schottky diode is in an "on" state and current flows through the diode. When the diode is reversely biased, a Schottky diode is in an "off" state and ideally current will not flow. Relative to other rectifier diodes, including PN-junction diode, the conventional Schottky diode exhibits high speed switching characteristics with very low forward conduction loss. Due to the combination of higher switching speeds and low forward conduction losses, Schottky diodes are commonly integrated as an internal diode within a semiconductor power device to function as a free-wheeling diode.

However, conventional Schottky diodes are not ideal. In reality, Schottky diodes experience an undesirable amount of reverse leakage current, which is detrimental to the performance of a circuit and results in a loss of power in the circuit. In addition, it is difficult to reliably enhance breakdown voltage of a Schottky diode without increasing forward conduction loss.

Accordingly, an improved Schottky diode for high-voltage applications with low reverse leakage current and high forward current drivability is desired.

SUMMARY

Embodiments generally relate to a high voltage device having a Schottky diode. In one embodiment, a high voltage Schottky diode is disclosed. The Schottky diode includes a substrate. A device well is disposed within the substrate and a drift region is disposed within the device well. A cathode region is disposed within the drift region. A guard ring region is disposed within the device well and adjacent to the drift region. A field isolation region is disposed on a top substrate surface. A dielectric film is disposed on the top substrate surface and contiguous to a side of the field isolation region. The dielectric film extends over the drift region and the guard ring region. A field plate is disposed over the field isolation region. The field plate extends to completely cover a top surface of the dielectric film and partially overlaps the guard ring region. A conductive contact layer is disposed adjacent to the dielectric film. The conductive contact layer contacts a portion of the device well to define a Schottky diode interface.

In another embodiment, a semiconductor device with at least one Schottky diode integrated into a high voltage device region is disclosed. The Schottky diode includes a substrate having an active region defined by a device isolation region. A device well is disposed within the substrate and encompasses the active region. A drift region is disposed within the device well and a cathode region is disposed in the drift region. The drift region and the cathode region comprise first polarity type dopants. A guard ring region is disposed within the device well and adjacent to the drift region. The guard ring region comprises second polarity type dopants opposite to the first polarity type. A field isolation region is disposed on a top substrate surface and extends over the drift region. A dielectric film is disposed on the top substrate surface and aligned to the field isolation region. The dielectric film extends over the guard ring region. A field plate is disposed over the field isolation region. The field plate extends to completely cover a top surface of the dielectric film and partially overlaps the guard ring region. A conductive contact layer is disposed adjacent to the dielectric film. The conductive contact layer contacts a portion of the device well to define a Schottky diode interface.

In yet another embodiment, a method for forming a Schottky diode is disclosed. The method includes providing a substrate and forming a device well within the substrate. A drift region is formed within the device well. A low voltage well is formed within the drift region. Forming the device well, the drift region and the LV well comprise implanting first polarity type dopants. A guard ring region is formed within the device well. The guard ring region is positioned adjacent to the drift region and implanted with second polarity type dopants opposite to the first polarity type. A field isolation region is formed on a top substrate surface. The field isolation region extends over the LV well and the drift region. A dielectric film is formed on the substrate. The dielectric film is aligned to the field isolation region and overlaps portions of the drift region and the guard ring region. A field plate is formed over the field isolation region. The field plate completely covers a top surface of the dielectric film. A conductive contact layer is formed on the substrate. The conductive contact layer is aligned to the dielectric film and contacts portions of the guard ring region and the device well.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIG. 2b shows a cross-sectional view along line A-A' of the Schottky diode in FIG. 2a, and FIG. 2c shows a cross-sectional view along line C-C' of the Schottky diode in FIG. 2a;

FIG. 3b shows a cross-sectional view along line A-A' of the Schottky diode in FIG. 3a, FIG. 3c shows a cross-sectional view along line B-B' of the Schottky diode in FIG. 3a, and FIG. 3d shows a cross-sectional view along line C-C' of the Schottky diode in FIG. 3a;

FIG. 4 shows a current-to-voltage graph of the Schottky diodes in FIGS. 2a and 3a.

DETAILED DESCRIPTION

Embodiments generally relate to semiconductor devices or integrated circuits (ICs). Specifically, embodiments relate to high voltage (HV) devices or ICs. High voltage devices can be employed as switching voltage regulators for power management applications. In some embodiments, one or more Schottky diodes are integrated into the HV devices. The devices or ICs can be incorporated into or used with, for example, AC/DC and DC/DC power conversion applications, motor drivers, medical equipment, and lighting systems. The devices or ICs can also be incorporated into other suitable high power applications.

Figure 1:
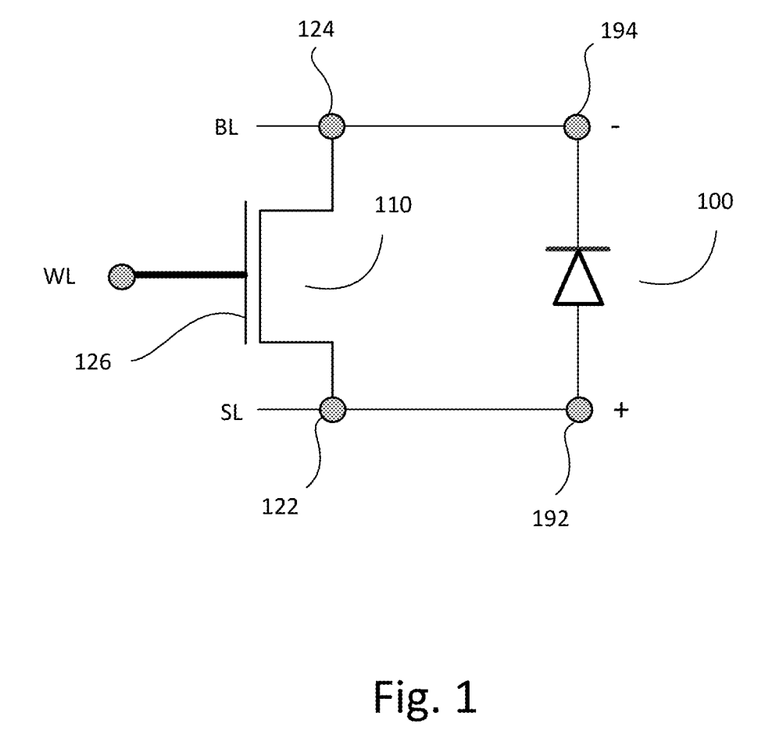
FIG. 1 shows a schematic diagram of an embodiment of a high power device.

FIG. 1 shows a simplified schematic diagram of an embodiment of a HV device.

The HV device includes an integrated Schottky diode 100 electrically coupled to a high voltage (HV) transistor 110, such as a laterally diffused metal oxide semiconductor (LDMOS) transistor. The HV transistor 110, for example, includes a transistor gate 126 disposed between a source terminal 122 and a drain terminal 124. It is understood that the Schottky diode 100 may also be coupled to other suitable types of HV devices. For example, the Schottky diode may be employed as a rectifier in switch-mode power supply circuits. The Schottky diode 100 is, in one embodiment, coupled in parallel to the HV transistor 110. For example, the anode terminal 192 of the Schottky diode 100 may be coupled to the transistor source terminal 122 and the cathode terminal 194 of the Schottky diode 100 may be coupled to the transistor drain terminal 124. Other configurations of Schottky diode and HV transistor may also be useful. In one embodiment, the HV transistor 110 is configured to achieve a breakdown voltage ($V_{BV}$) in excess of 40 V. For example, the $V_{BV}$ of the HV transistor 110 is about 50 V or more. Providing a HV transistor with other $V_{BV}$ may also be useful.

Figure 2A:
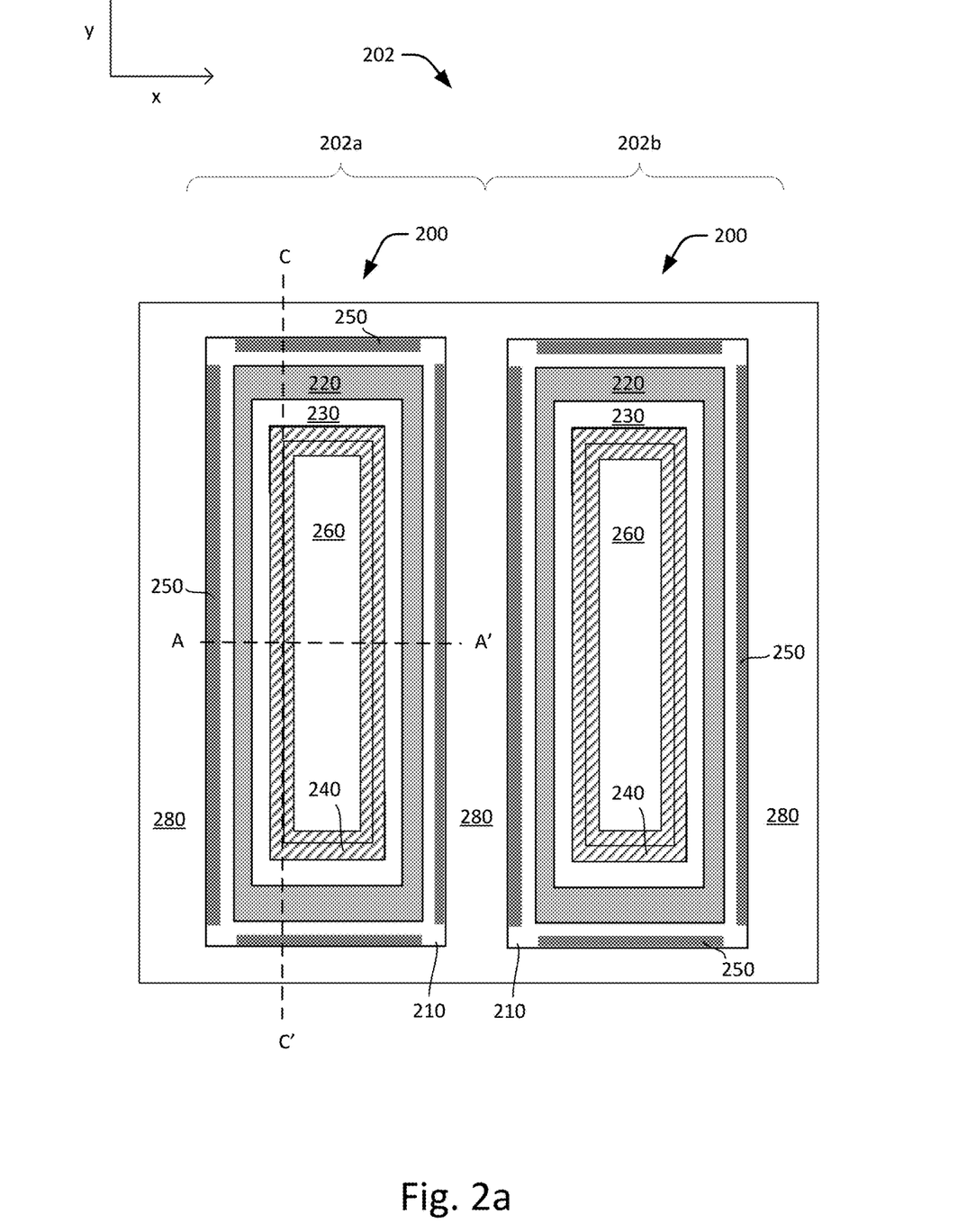
FIG. 2a shows a simplified layout diagram of a Schottky diode according to an embodiment of the present invention.
Figure 2B:
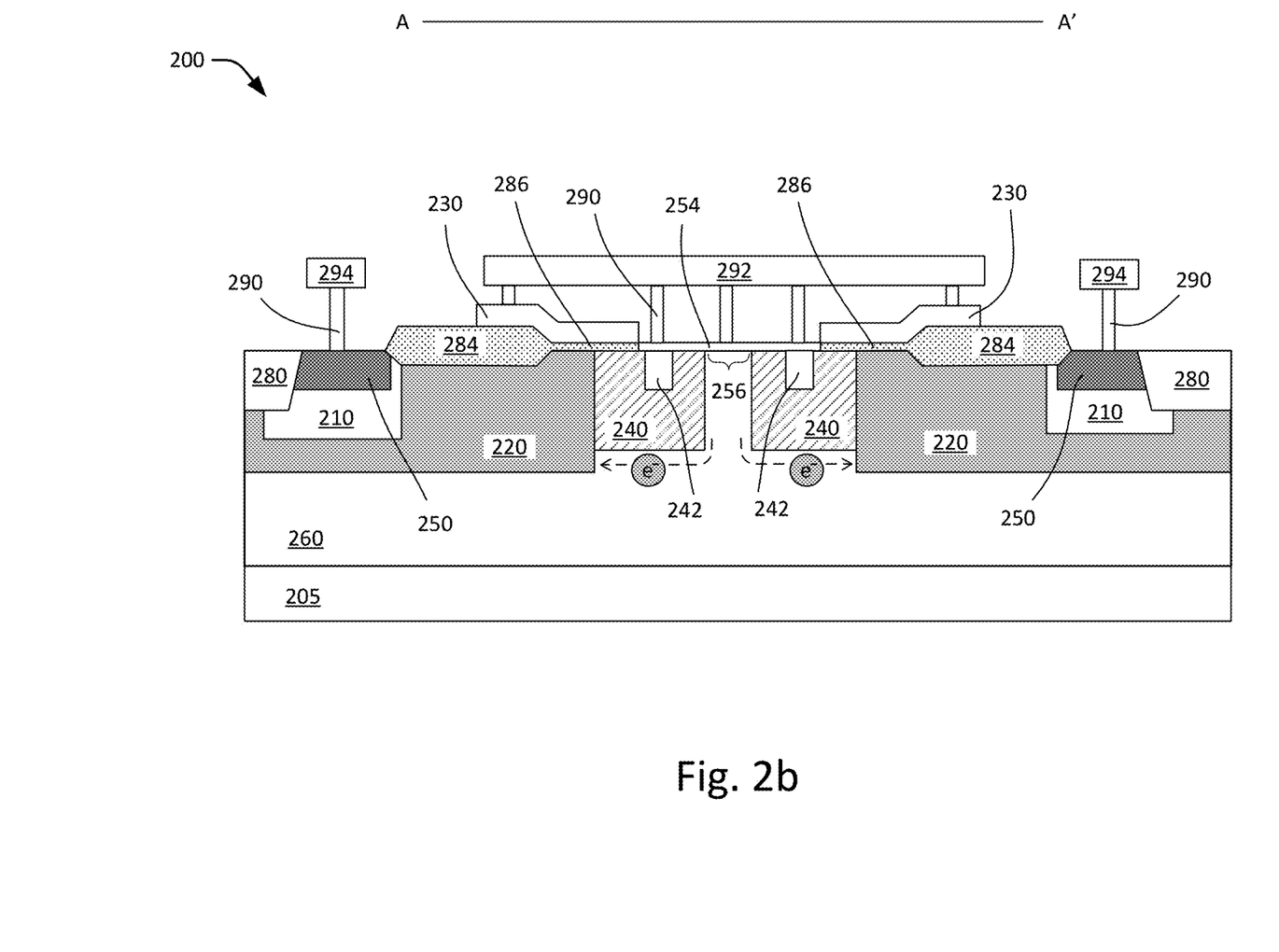
Figure 2C:
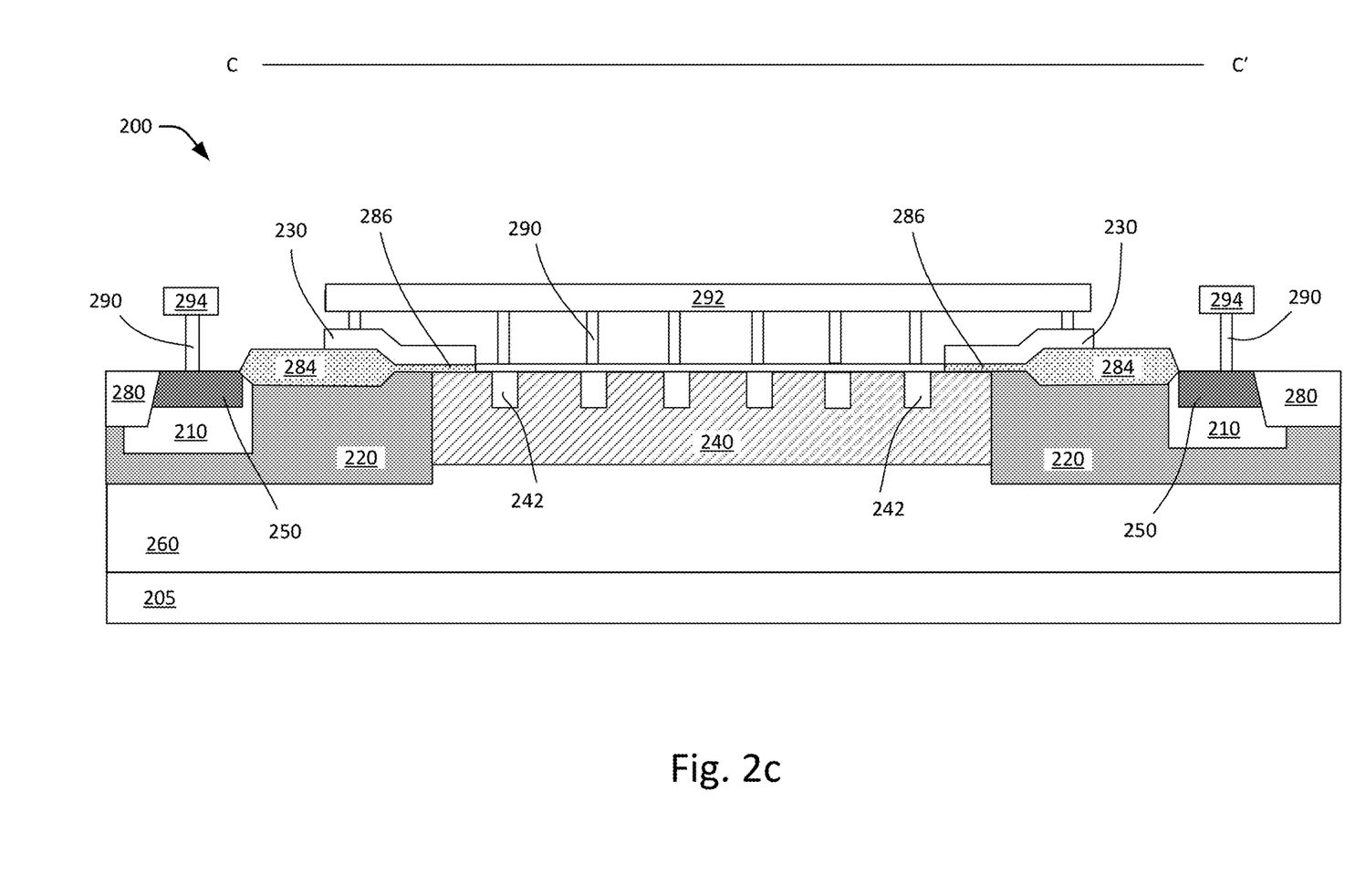

FIGS. 2a-2c show multiple views of a Schottky diode 200 according to an embodiment of the present disclosure. Specifically, FIG. 2a shows a simplified layout diagram of a first Schottky diode 200 positioned adjacent to a second Schottky diode 200, FIG. 2b shows a cross-sectional view along line A-A' of a Schottky diode 200 in FIG. 2a, and FIG. 2c shows a cross-sectional view along line C-C' of a Schottky diode 200 in FIG. 2a. The Schottky diodes 200 may be disposed within active regions of a HV device region 202. For example, the HV device region 202 comprises a first active region 202a for the first Schottky diode 200 and a second active region for the second Schottky diode 200. The active regions 202a and 202b may be internal diode regions of a HV device. Although a first and a second active region 202a and 202b for a first and a second Schottky diode is described, it is to be appreciated that the HV device region 202 may include any suitable number of active regions (or diode regions) to accommodate a corresponding number of Schottky diodes, depending on design requirements.

The HV device region 202 includes a semiconductor substrate 205. The substrate, for example, is a silicon substrate. Other types of substrates, such as silicon germanium, germanium, gallium arsenide, or crystal-on-insulator (COI) such as silicon-on-insulator (SOI), are also useful. The substrate 205 may be a doped substrate. For example, the substrate is lightly doped with p-type dopants. Providing a substrate with other types of dopants or dopant concentrations, as well as an undoped substrate, may also be useful. The substrate may also include other device regions or regions (not shown) for other types of circuitry, depending on the type of device or IC. For example, the substrate may also include regions for both n-type and p-type transistors to form a complementary MOS (CMOS) device. The substrate may include device regions for different voltage transistors, such as high voltage (HV), intermediate voltage (IV) and low voltage (LV) transistors. Providing device regions for other types of devices, including memory devices, within the substrate may also be useful.

Referring to FIG. 2a, a device isolation region 280 may be provided for isolating or separating the HV device region 202 from other device regions (not shown) on the substrate. In one embodiment, the device isolation region surrounds each of the active regions and isolates the first active region 202a from the second active region 202b. The isolation region, for example, includes a trench filled with dielectric material, such as silicon oxide. Other types of isolation regions may also be employed. In one embodiment, the device isolation region 280 includes a depth of about 0.5-10 μm. For example, the device isolation region is a deep trench isolation (DTI) region extending from the top substrate surface to a depth of about 10 μm or more. Providing isolation regions which extend to other suitable depths may also be useful, depending on isolation requirements. For example, the device isolation region may also be a shallow trench isolation (STI) region having a depth of about 3000-5000 Å from the top substrate surface. The DTI region may have a top surface which is substantially coplanar with the top surface of the substrate.

The HV device region 202 may include doped regions of different dopant concentrations within the substrate 205. For example, the device region 202 may include heavily doped ($x^+$), intermediately doped (x) and lightly doped ($x^-$) regions, where x is the polarity type which can be p or n. A lightly doped region may have a dopant concentration of about 1E15-1E17/cm$^3$, an intermediately doped region may have a dopant concentration of about 1E17-1E19/cm$^3$, and a heavily doped region may have a dopant concentration of about 1E19-1E21/cm$^3$. Providing other dopant concentrations for the different doped regions may also be useful, for example, depending on the breakdown voltage requirement. P-type dopants may include boron (B), aluminum (Al), indium (In) or a combination thereof, while n-type dopants may include phosphorous (P), arsenic (As), antimony (Sb) or a combination thereof.

Referring to FIGS. 2b and 2c, each of the active regions 202a and 202b includes a deeply doped device well 260 disposed in the substrate. In one embodiment, the device well 260 extends from the top substrate surface to a depth below the device isolation region 280. The depth of the device well 260 is, for example, about 4-10 μm. Other suitable depth dimensions may also be useful. The device well 260, as shown, encompasses an entire active region within the device isolation region 280. For example, the device well 260 underlaps at least a portion of the device isolation region 280. In one embodiment, the device well 260 is a common device well of the active regions 202a and 202b. For example, the device well 260 encompasses the entire HV device region 202. In such case, the device well 260 extends along an x-direction (or width direction) beyond the portion of device isolation region 280 interjacent the active regions 202a and 202b to completely traverse the width of the first and second active regions 202a and 202b, and extends along a y-direction (or length direction), which is perpendicular to the x-direction, to completely traverse the length of the first and second active regions 202a and 202b. It is understood that separate device wells 260 may also be provided for each of the active regions without departing from the spirit of the invention.

The device well 260 is lightly doped with first polarity type dopants for a first polarity type HV device. For example, the dopant concentration of the device well 260 may be about $5E16/cm^3$. Providing a device well having other dopant concentrations may also be useful. The first polarity type may be n-type or p-type. In one embodiment, the first polarity type is n-type. For example, the device well 260 may be a deeply doped n-type well for a n-type HV transistor 110. Providing a p-type device well may also useful, depending on design requirements. For example, the device well 260 may include p-type dopants for a p-type HV device.

A Schottky diode 200 is provided within each of the active regions 202a and 202b, as shown particularly in FIG. 2a. The Schottky diode 200 includes a drift region 220 disposed within the device well 260. In one embodiment, the drift region 220 includes a closed ring shape having first and second long sides extending in parallel along the y-direction, and first and second short sides extending in parallel along the x-direction. The drift region 220, for example, includes a rectangular surface topology having a rectangular aperture in the drift region 220. Other configurations of the drift region 220 may also be useful. The drift region 220 surrounds a top portion of the device well 260. The long and short sides of the drift region 220 may be aligned to the device isolation region 280 to surround the top portion of an active region (e.g., 202a). In one embodiment, the long and short sides of the drift region 220 include a uniform width extending throughout. For example, the long and short sides of the drift region 220 may have a width of about 2 µm. Other suitable width dimensions for the sides of the drift region 220 may also be useful. It is appreciated that the width of the long sides may depend on the desired forward current performance while the width of the short sides may depend on the desired operational voltage.

The drift region 220 serves to support a high $V_{BV}$ when the Schottky diode is in an "off" state (blocking current flow) and serves to provide a conduction path between the anode and cathode regions when the Schottky diode is in an "on" state (allowing current (e) flow). A depth of the drift region 220 may be shallower than the device well 260. In one embodiment, the drift region 220 extends to a depth deeper than the device isolation regions 280 and underlaps a portion of the device isolation regions 280. For example, the drift region extends from the top substrate surface to a depth of about 3-5 µm. Other depths for the drift region may also be useful depending on isolation requirements. The drift region 220 may be a doped region (hereinafter "drift well") defined by first polarity dopants for a first polarity type HV device. In one embodiment, the first polarity type is n-type. For example, the drift well 220 may be intermediately doped with n-type dopants for a n-type HV device. Alternatively, the first polarity type dopants may be p-type for a p-type HV device. The dopant concentration of the drift well 220 is higher than the device well 260. For example, the dopant concentration of the drift well 220 may be about $1E17-5E17/cm^3$. Other suitable dopant concentration for the drift well 220 may also be useful.

The Schottky diode 200 includes a cathode region disposed in the active region (e.g., 202a). The cathode region, in one embodiment, comprises a cathode contact region 250 defined within a low voltage (LV) well 210. For example, the cathode contact region 250 extends from the top substrate surface to a depth shallower than the LV well 210. In one embodiment, the LV well 210 is disposed within the drift region 220. For example, the LV well 210 extends from the top substrate surface to a depth shallower than the depth of the drift region 220. In one embodiment, the depth of the LV well 210 extends below the device isolation region 280 and underlaps a portion of the device isolation region 280. The depth of the LV well 210 may be about 1.0-1.5 µm. Other depths of LV well may also be useful. The cathode region may include first polarity dopants for a first polarity type HV device. In one embodiment, the LV well 210 includes n-type dopants for an n-type HV device or p-type dopants for a p-type HV device. The LV well 210 is, for example, intermediately doped with n-type dopants. The dopant concentration of the LV well may be about $1E18-5E18/cm^3$. Other dopant concentrations for the cathode region may also be useful.

Similar to the drift region 220, the LV well 210 includes a closed ring shape having first and second long sides extending in parallel along the y-direction, and first and second short sides extending in parallel along the x-direction, as shown particularly in FIG. 2a. The LV well 210, for example, includes a rectangular surface topology having a rectangular aperture in the LV well. Other configurations of the LV well 210 may also be useful. The LV well 210 surrounds a top portion of the device well 260 and drift region 220. The long and short sides of the LV well 210 may be aligned to the device isolation region 280. In one embodiment, the long and short sides of the LV well 210 include a uniform width extending throughout. For example, the long and short sides of the LV well 210 may have a width of about 1 µm. Other suitable width dimensions for the sides of the LV well 210 may also be useful.

The cathode contact region 250 extends along the length of the long and short sides of the LV well 210. The cathode contact region 250 is, for example, aligned to the device isolation region 280. In one embodiment, the cathode contact region 250 is a heavily doped region extending along the long and short sides of the LV well 210. For example, the cathode contact region 250 corresponds to stripes of heavily doped regions extending along the sides of the LV well 210. In an alternative embodiment, the cathode contact region 250 may correspond to a heavily doped contact region extending continuously in a closed ring shape, similar to the LV well 210. Other configurations of cathode contact region may also be useful. In one embodiment, the cathode contact regions 250 include first polarity type dopants for a first polarity type HV device. The first polarity type may be n-type or p-type. For example, the cathode contact regions 250 are heavily doped with n-type dopants for an n-type HV device. The dopant concentration of the cathode regions 250 are, for example, about $1E21-5E21/cm^3$. Other dopant concentrations for the cathode contact regions 250 may also be useful. It is understood that the cathode contact regions 250 may be provided with metal silicide contacts (not shown) disposed on each contact stripe. Metal silicide contacts may be employed to reduce parasitic contact resistance and facilitate contact to back-end-of-line (BEOL) metal interconnects.

The Schottky diode 200 includes a guard ring region 240 disposed within the device well 260. Similar to the drift region 220, the guard ring region 240 includes a closed ring shape having first and second long sides extending in parallel along the y-direction, and first and second short sides extending in parallel along the x-direction, as shown particularly in FIG. 2a. The guard ring region 240, for example, includes a rectangular surface topology having a rectangular aperture in the guard ring region 240 which exposes an innermost portion of the device well 260. Other configurations of guard ring region 240 may also be useful. In one embodiment, the guard ring region 240 is concentrically disposed within the rectangular aperture of the drift region 220 and is aligned to inner edges of the drift region 220. The guard ring region 240 is, for example, separated from the cathode contact region 250 by the LV well 210 and drift region 220. In one embodiment, the guard ring region 240 includes second polarity type dopants for a first polarity type HV device. The second polarity type may be p-type or n-type. For example, a p-type guard ring region is provided for a n-type HV device. In one embodiment, the guard ring region 240 is intermediately doped with p-type dopants. The dopant concentration of the guard ring region is, for example, about $1E17-5E17/cm^3$.

The guard ring region 240 may include a sufficient depth to achieve the desired $V_{BV}$. In one embodiment, the depth of the guard ring region 240 may be deeper than the LV well 210 and shallower than the drift region 220. For example, the guard ring region 240 extends from the top substrate surface to a depth of about 3-5 µm. Other depths for the guard ring region may also be useful. The guard ring region 240 includes a sufficient width to serve as a RESURF (Reduced Surface Field) region of the Shottky diode 200. In one embodiment, the long and short sides of the guard ring region 240 include a uniform width extending throughout. For example, the long and short sides of the guard ring region 240 may have a width of at least 1 µm. Other suitable width dimensions for the guard ring region 240 may also be useful. For example, the long and short sides of the guard ring region may include different widths.

One or more guard ring contact regions 242 may be defined in the guard ring region 240. For example, segments of guard ring contact regions 242 may be disposed within the guard ring region 240. In one embodiment, similar processes and process parameters may be employed to form the guard ring contact regions 242 and cathode contact regions 250. For example, the guard ring contact regions 242 include a dopant concentration substantially equal to the cathode contact regions 250, and a depth substantially equal to the depth of the cathode contact regions 250. Other dopant concentrations or configurations of guard ring contact regions 242 and cathode contact regions 250 may also be useful. For example, the guard ring contact regions 242 and cathode contact regions may be configured with different depths and dopant concentrations. In one embodiment, the plurality of guard ring contact regions 242 are spaced apart from each other. The guard ring contact regions 242 are, for example, positioned to correspond with locations where contact plugs 290 are to be formed over the guard ring region 240.

Although the guard ring contact regions 242 are shown as segments of heavily doped contact regions, it is appreciated that the guard ring contact regions 242 may also include similar configurations as the cathode contact region 250. For example, the guard ring contact regions 242 may be configured as stripes of heavily doped regions extending along the long and short sides of the guard ring region 240. Alternatively, the guard ring contact region 242 may be configured as a heavily doped contact region extending continuously in a closed ring shape.

The Schottky diode 200 includes an anode region positioned in the innermost portion of the active region (e.g., 202a). In one embodiment, the anode region is disposed over the innermost portion of the device well 260 while the drift region 220 and the cathode region (e.g., LV well 210) are positioned concentrically outwards. The long and short sides of the guard ring region 240, which are adjacent to the corresponding long and short sides of the drift region 220, surround the edges of the anode region. The anode region includes a Schottky contact 254 and a Schottky diode interface 256. In one embodiment, the Schottky contact 254 is a conductive layer disposed on the top substrate surface and covers the device well 260 portion exposed within the rectangular aperture (or opening) in the guard ring region 240. For example, the Schottky contact 254 extends partially over the guard ring region 240 to overlap the guard ring contact regions 242, as shown particularly in FIGS. 2b and 2c. The Schottky contact 254 may be formed from any suitable metal or metal silicide material, including nickel silicide, cobalt silicide, titanium silicide, tantalum silicide and combinations thereof. Other conductive materials may also be useful.

The portion of device well 260 which contacts the Schottky contact 254 defines the Schottky diode interface 256. For example, the Schottky diode interface 256 is disposed about the top substrate surface. The Schottky diode interface 256 may include an area corresponding to an area of the top substrate surface circumscribed by the guard ring region 240. The dimension of the Schottky diode interface 256 may be defined by the desired operational voltage. For example, the Schottky diode interface 256 includes a width (e.g., measured along the x-direction) sufficient to provide the desired forward current performance without increasing reverse leakage current.

A field isolation region 284 may be disposed on the substrate 205. In one embodiment, the field isolation region 284 is positioned between the cathode contact region 250 and the guard ring region 240. For example, the field isolation region 284 is adjacent to the cathode contact region 250 and extends laterally to overlap a portion of the drift region 220. In one embodiment, the field isolation region 284 includes dielectric material, such as silicon oxide. For example, the field isolation region 284 is a field oxide. Other types of dielectric material may also be used to form the field isolation region 284. The field isolation region, for example, includes a thickness range of about 1000-3000 Å. Providing a field isolation region having other thicknesses may also be useful, depending on isolation requirements. The field isolation region is formed with a suitable width to provide surface isolation between the anode region and the cathode region of the Schottky diode 200.

The Schottky diode 200 includes a dielectric film 286 disposed on the substrate 205. For example, the dielectric film 286 is disposed between the field isolation region 284 and the Schottky contact 254 to overlap a portion of the guard ring region 240 and a portion of the drift region 220. In one embodiment, the dielectric film 286 is contiguous to an inner edge of the field isolation region and an outer edge of the Schottky contact 254. The dielectric film 286, for example, extends from the field isolation region to the Schottky contact 254. In embodiment, the dielectric film 286 may be formed from similar processes and/or process parameters as a HV gate dielectric to define a thickness that is thinner than the field isolation region 284. For example, a thickness of the dielectric film may be about 50-500 Å. Providing a dielectric film having other suitable thicknesses may also be useful. In one embodiment, the dielectric film 286 includes a same material as the field isolation region 284. For example, the dielectric film 286 comprises silicon oxide material. Other suitable dielectric materials may also be useful. For example, the dielectric film 286 may include silicon nitride, pure-oxide, nitrided-oxide and combinations thereof.

In one embodiment, a conductive field plate 230 is disposed over the field isolation region 284 and the dielectric film 286, as shown particularly in FIGS. 2b and 2c. In one embodiment, the field plate 230 includes a uniform thickness throughout. For example, a thickness of the field plate 230 is about 500-5000 Å. Other thicknesses of field plate may also be useful. In one embodiment, the field plate may be formed from similar processes and/or process parameters for forming a polysilicon gate electrode. The field plate is, for example, a polysilicon plate. Other materials may also be used to form the field plate. It is understood that a polysilicon field plate 230 may be suitably doped to increase conductivity and improve performance. For example, a polysilicon field plate 230 may be heavily doped with n-type dopants for a n-type HV device or p-type dopants for a p-type HV device. In one embodiment, the field plate 230 is aligned to the outer edge of the Schottky contact 254 and extends conformally over the dielectric film 286 to partially overlap the field isolation region 284. For example, the field plate 230 covers the entire top surface of the dielectric film 286 and extends to partially cover a planar top surface of the field isolation region 284. The field plate may serve to suppress or reduce surface electric fields at the edge of the Schottky contact 254.

A dielectric layer (not shown) may be disposed over the substrate 205. It is understood that there may be additional layers between the dielectric layer and the substrate, such as an etch stop layer. The dielectric layer may be a dielectric stack comprising upper and lower dielectric layers. The upper dielectric layers may include interlevel dielectric (ILD) layers in which a plurality of metal lines (or interconnects) are formed in one or more metal levels of the ILD layers. The lower dielectric layers may include a pre-metal dielectric (PMD) layer in which metal contact plugs are formed in via openings to connect contact regions of the Schottky diode 200 to the metal lines in the ILD layers. The upper and lower dielectric layers may include any suitable dielectric material, including silicon oxide.

As shown, contact plugs are provided to connect the Schottky contact 254, field plate 230 and cathode contact regions 250 to metal lines 294 and 292 in the ILD layer. For example, contact plugs are disposed over the cathode region to couple the cathode contact regions 250 to metal lines 294 of a same metal level. In one embodiment, multiple contact plugs are provided to couple the Schottky contact 254 and field plate 230 to a common metal line 292 disposed over the anode region. The common metal line 292 may be a disposed on a different metal level from the metal lines 294 above the cathode region. For example, the common metal line 292 may be disposed on a first metal level and the metal lines 294 above the cathode region may be disposed on a second metal level different from the first metal level. Metal lines disposed on the same metal level may extend along the same direction while metal lines disposed on different metal levels may extend along different directions. For example, the common metal line 292 of the first metal level may extend along a first direction while the metal lines 294 of the second metal level may extend along a second direction perpendicular to the first direction. Other suitable configurations of metal lines and metal levels may also be useful. It is understood that the first and second metal levels may be any suitable metal level of the ILD layers, and the first and second metal levels need not be in adjacent ILD layers.

In one embodiment, the contact plugs 290 in the anode region may be positioned to correspond with the position of the guard ring contact regions 242 and with a portion of the Schottky diode interface 256. It is understood that the Schottky diode 200 of the present invention may be integrated into a HV integrated circuit. In such case, the metal lines 294 over the cathode region may be coupled to a first power supply terminal of the HV integrated circuit while the common metal line 292 over the anode region may be coupled to a second power supply terminal of the HV integrated circuit. For example, the metal lines 294 over the cathode region may be connected to a high voltage terminal of the HV integrated circuit while the common metal line 292 may be connected to a low voltage terminal of the HV integrated circuit. Other power supply configurations may also be useful. As the contact plugs 290 commonly couple the field plates 230 and Schottky contact 254 to the common metal line 292, it is appreciated that the common metal line 292 provides a common biasing potential to the field plate 230, Schottky contact 254 and guard ring contact regions 242.

Additional dielectric layers (not shown) may be formed over the PMD and ILD layers. The additional dielectric layers include interconnects having contacts and conductive or metal lines formed therein. The HV device may include multiple interconnect levels. The interconnects, for example, provide connections to other contact regions of the HV device.

Figure 3A:
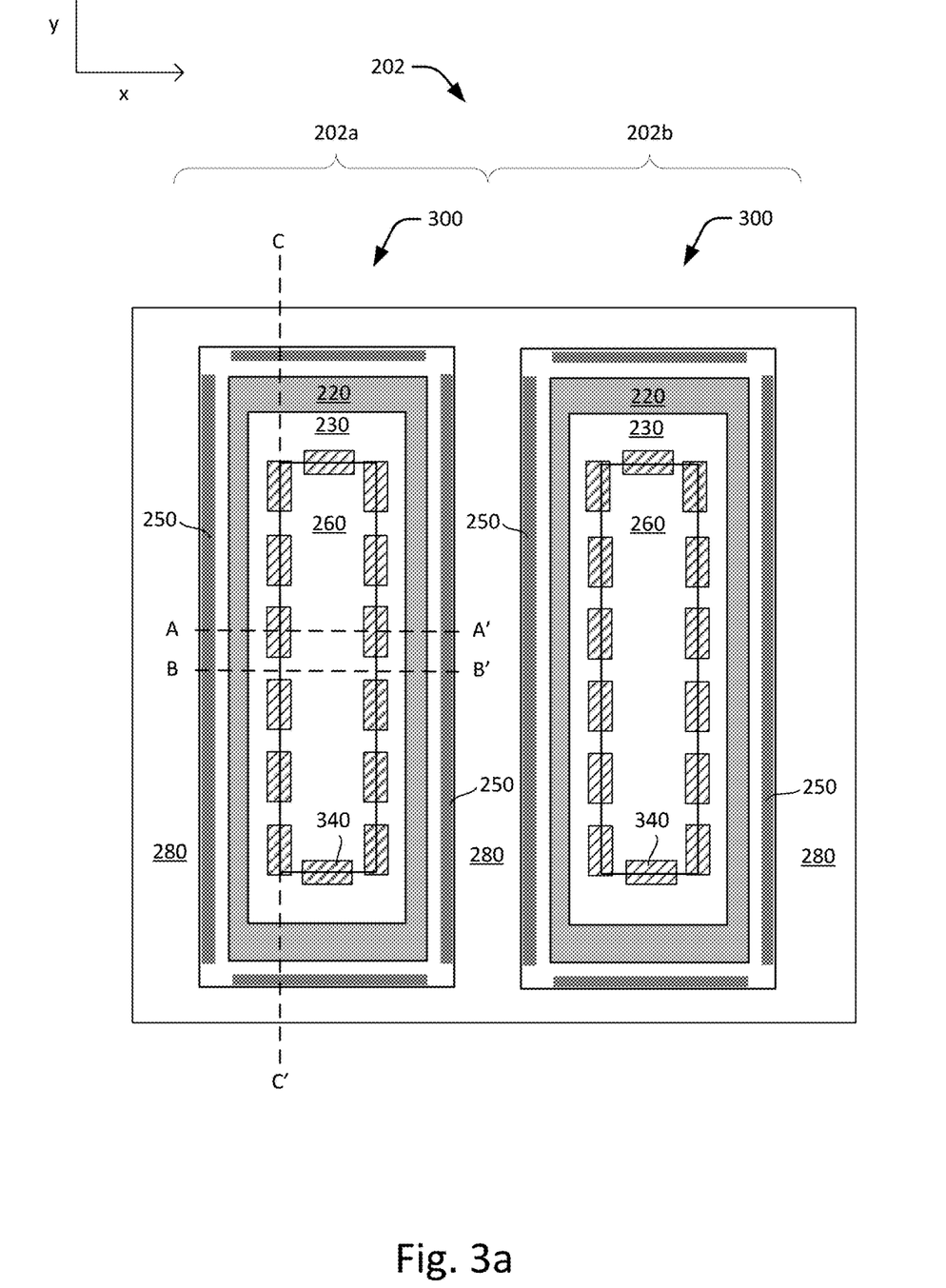
FIG. 3a shows a simplified layout diagram of a Schottky diode according to another embodiment of the present invention.
Figure 3B:
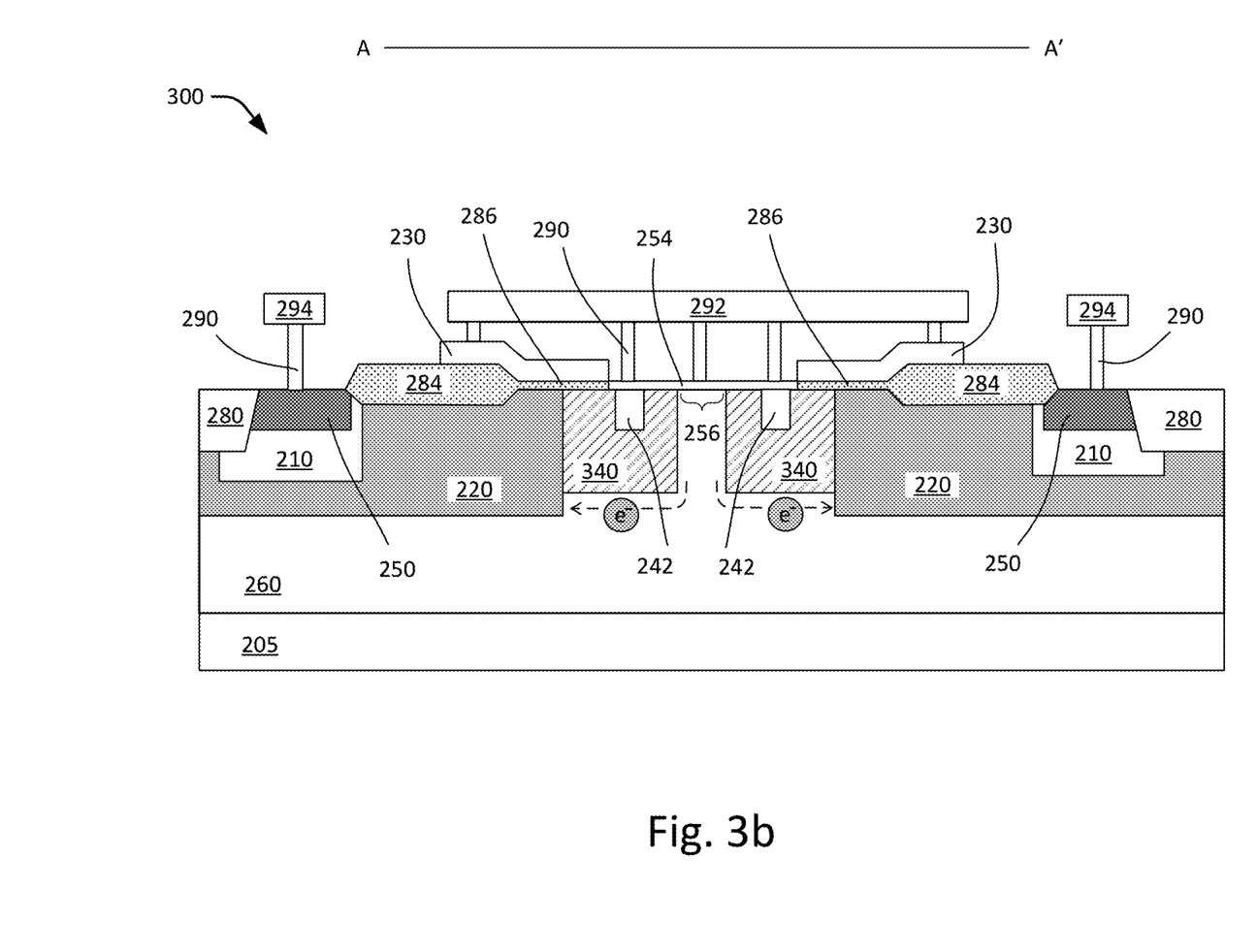
Figure 3C:
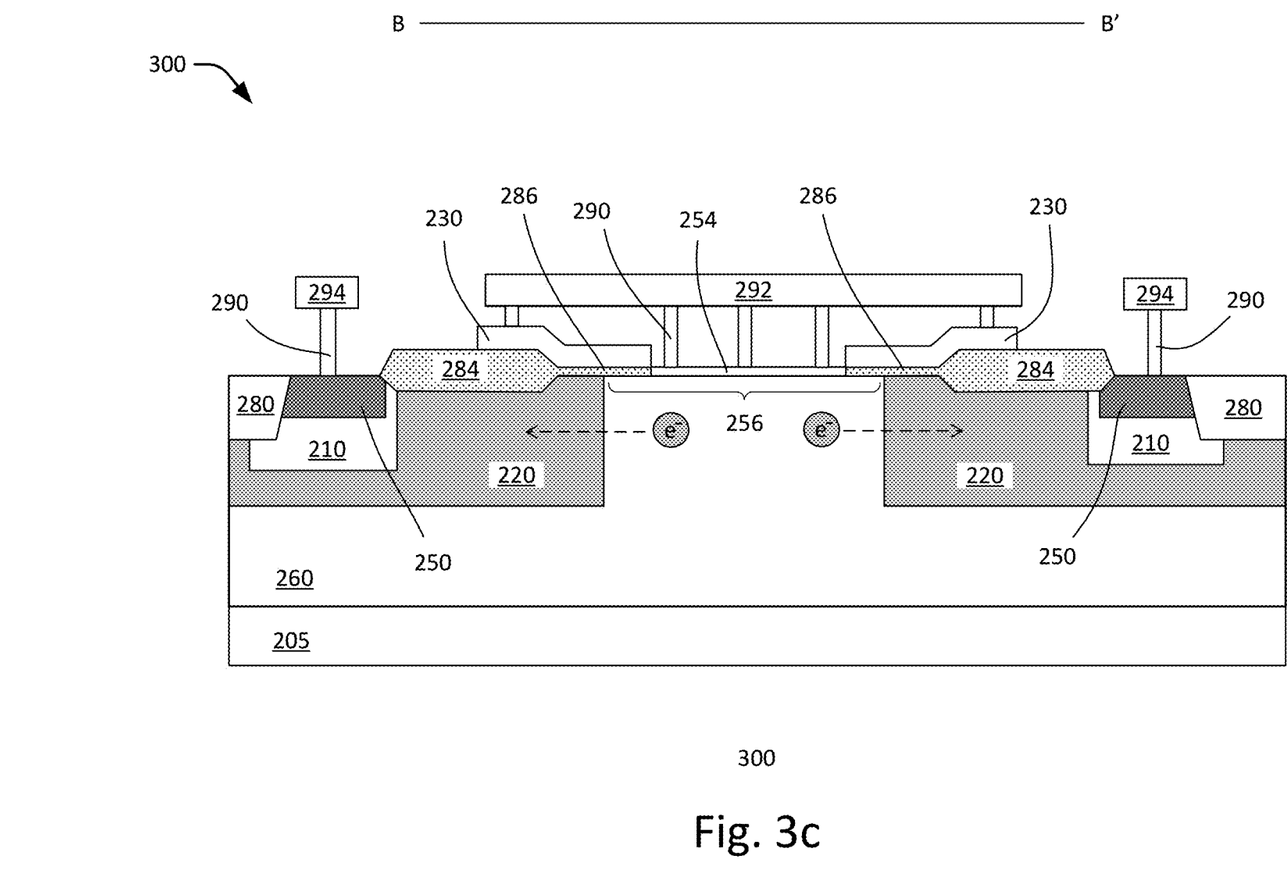
Figure 3D:
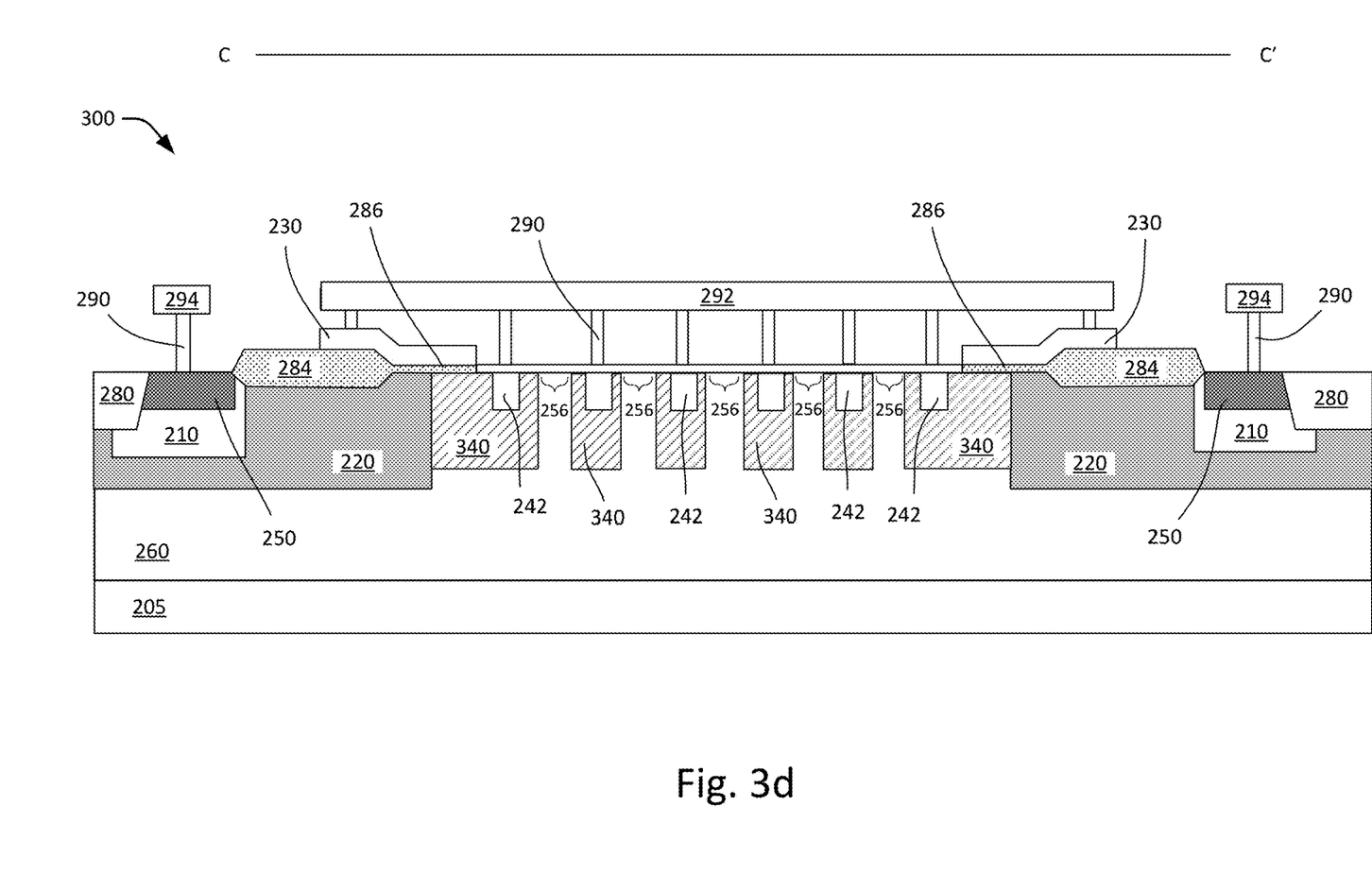

FIGS. 3a-3d show multiple views of a Schottky diode 300 according to another embodiment of the present disclosure. Specifically, FIG. 3a shows a simplified layout diagram of a first Schottky diode 300 positioned adjacent to a second Schottky diode 300, FIG. 3b shows a cross-sectional view along line A-A' of a Schottky diode 300 in FIG. 3a, and FIG. 3c shows a cross-sectional view along line C-C' of a Schottky diode 300 in FIG. 3a. The Schottky diode 300 is similar to that described in FIGS. 2a-2c. Common elements and features having the same reference numerals may not be described or described in detail. In the interest of brevity, the description of the Schottky diode 300 below primarily focuses on the difference(s) compared with the Schottky diode 200 shown in FIGS. 2a-2c.

Referring to FIGS. 3a-3d, the Schottky diode 300 differs from the Schottky diode 200, shown particularly in FIGS. 2a-2c, in that the Schottky diode 300 includes a guard ring region 340 having a segmented ring shape concentrically disposed within the rectangular aperture in the drift region 220. In one embodiment, the segmented (or discontinuous) guard ring region 340 is defined by segments of intermediately doped p-type regions. The segments of p-type regions are, for example, disposed along the long and short sides of the guard ring region 340. Other configurations of a discontinuous guard ring region may also be useful.

As shown, the segments of p-type regions disposed along each side of the guard ring region 340 are aligned to form diametrically opposing pairs of p-type doped segments to optimize current flow. It is appreciated that diametrically opposing segments of the guard ring region 340 may also be formed without being substantially aligned. A segment of the guard ring region 340 is separated from another segment of the guard ring region 340 by interjacent portions of device well 260. The segments of guard ring region 340 are spaced apart sufficiently to provide the desired forward current performance without increasing reverse leakage current.

In the above embodiments, although the drift region 220, cathode region and guard ring region are illustrated as having a rectangular ring shape, it is understood that the drift region 220, cathode region and guard ring region of the Schottky diodes 200 and 300 may include any suitable shapes without departing from the spirit of the present invention. A Schottky diode, in accordance with the above embodiments, includes a guard ring region surrounding the edges of the Schottky contact 254. The guard ring region provides edge termination, to prevent or reduce reverse current leakage. It will also be noted that the Schottky contact 254 is surrounded by a conductive field plate 230, which extends partially over the guard ring region. The field plate serves to distribute electric field across the substrate between the anode region and the cathode region. This reduces impact ionization at the edge of the Schottky contact 254, which improves Schottky diode interface breakdown voltage ($V_{BV}$) and allows further reduction of reverse current leakage.

In the above embodiments, the Schottky diodes maintain a low reverse leakage current in the pA/μm range while achieving a high $V_{BV}$ of more than 40 V. Providing a LV well to the cathode contact region of the Schottky diode forms a gradient cathode junction to reduce resistance for forward operation. Biasing the field plate 230, Schottky contact 254 and guard ring contact regions 242 to a common potential allows a high $V_{BV}$ to be achieved.

Figure 4:
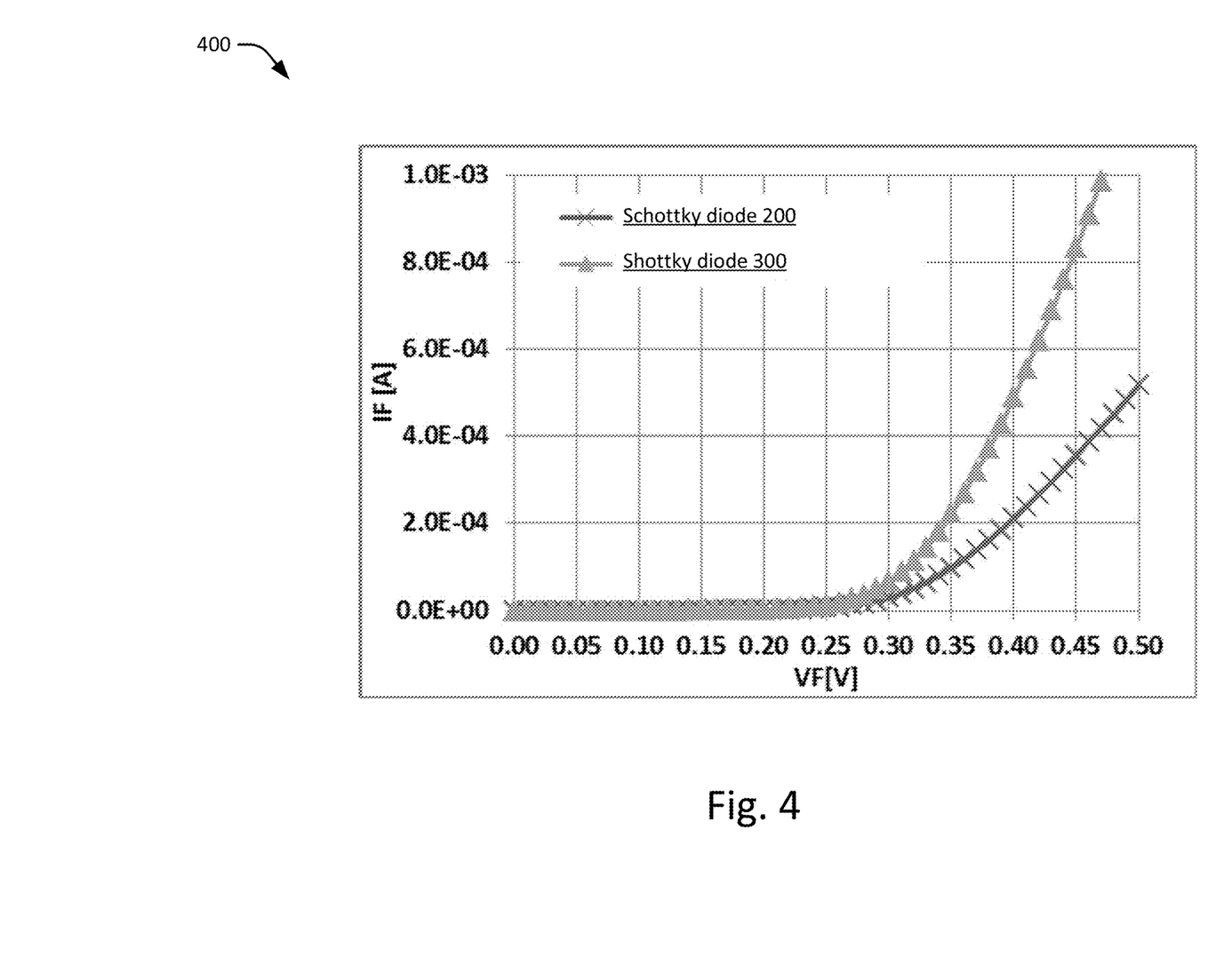

With respect to the embodiment described in FIGS. 3a-3d, each of the segments of p-type doped region functions as a RESURF (Reduced Surface Field) structure within the device well. For example, the discontinuous guard ring region 340 provides the Schottky diode 300 with multiple RESURF regions, which further reduces electric fields in the Schottky diode 300, allowing for a better forward performance to be achieved while maintaining a high $V_{BV}$ and a low reverse leakage current. The improved forward performance of the Schottky diode 300 in FIG. 3a relative to the Schottky diode 200 in FIG. 2a is shown particularly in FIG. 4, which depicts a forward current (IF)-to-forward voltage (VF) graph 400 of the respective Schottky diodes. For example, the enhanced forward performance of the Schottky diode 300 is illustrated by the steeper IF/VF curve relative to the Schottky diode 200.

Figure 5:
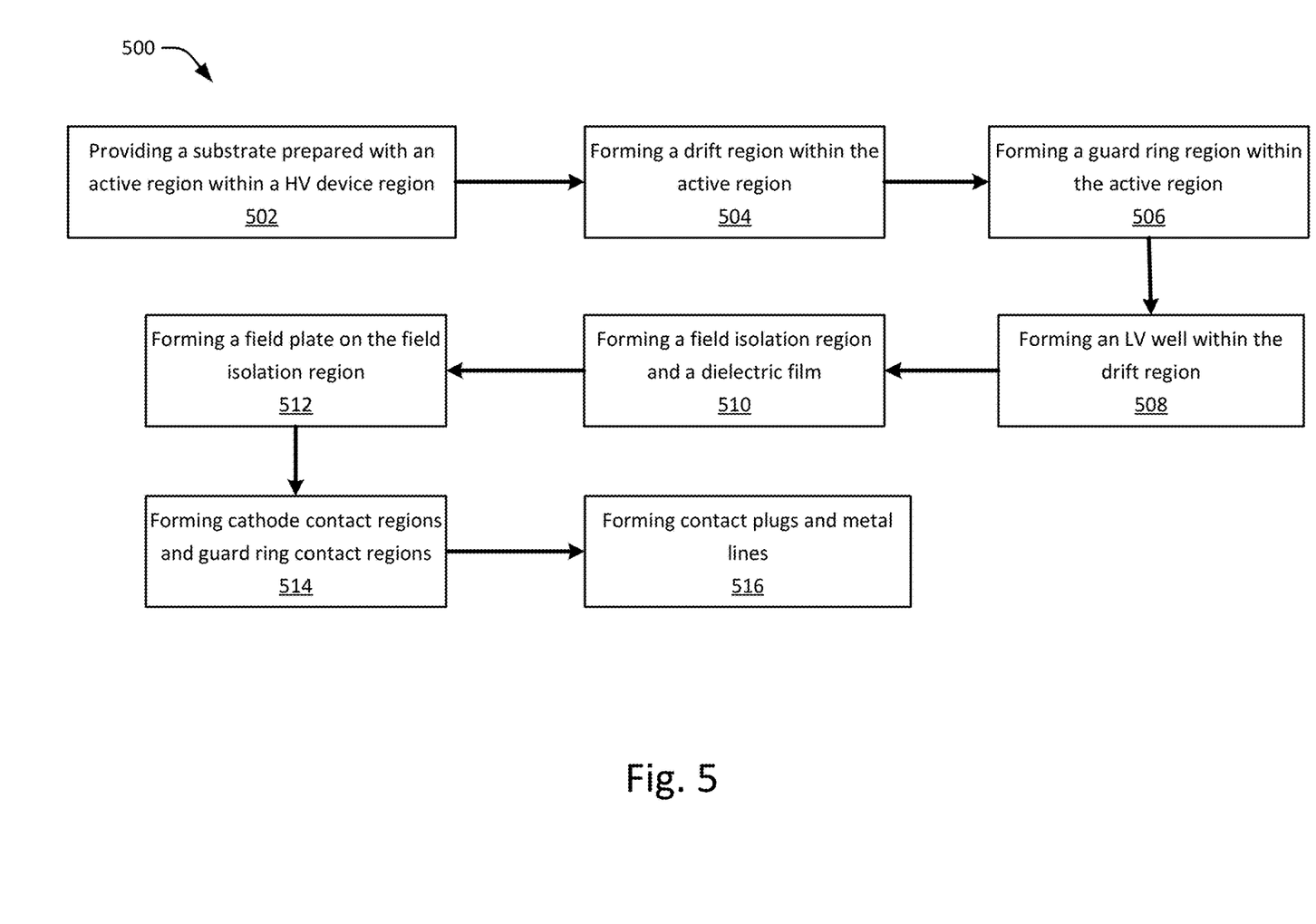
FIG. 5 shows a simplified process flow for forming a Schottky diode according to an embodiment of the present invention.

FIG. 5 shows a simplified process flow 500 for forming a HV device with one or more integrated Schottky diodes according to an embodiment of the present invention. The process 500 may be employed for 0.13 micron technology node. In one embodiment, the process 500 is compatible with Bipolar CMOS DMOS (BCD) manufacturing processes. For example, a BCD process for may be employed to form an integrated Schottky diode, in accordance with the present invention, without additional process steps or masks.

In step 502, a substrate 205 with a HV device region is provided. In one embodiment, the HV device region comprises an active region. The active region is, for example, defined by a device isolation region. The HV device region may include a n-type doped device well 260 encompassing the active region. In the case where more than one active region is defined within the HV device region, the n-type doped device well may be a common device well of two or more active regions.

In step 504, a drift region 210 is formed in the active region. The drift region may be formed within the device well 260 by any suitable doping techniques, including ion implantation. For example, a patterned implant mask is employed to selectively implant n-type dopants into the device well to form the drift region. The drift region may be a closed ring shape, such as a rectangular ring shape.

In step 506, a guard ring region is formed in the active region. The guard ring region may be formed within the device well by any suitable doping techniques, including ion implantation. For example, a patterned implant mask is employed to selectively implant p-type dopants into the device well 260 to form the guard ring region. In one embodiment, a guard ring region 240 having a closed ring shape, such as a rectangular ring shape, is formed. In an alternative embodiment, a guard ring region 340 having a segmented (or discontinuous) rectangular ring shape is formed. The guard ring region is disposed concentrically within the rectangular aperture of the drift region.

In step 508, a LV well 210 is formed in the active region. The LV well may be formed within the drift region 220 by any suitable doping techniques, including ion implantation. For example, a patterned implant mask is employed to selectively implant n-type dopants into the drift region to form the LV well. The LV well may be a closed ring shape, such as a rectangular ring shape. The LV well defines a cathode region of the Schottky diode. Although, the LV well is described as being formed after forming the guard ring region, it is understood that the LV well may also be formed prior to forming the guard ring region.

In step 510, a dielectric region is formed on the substrate surface of the active region. The dielectric region, for example, comprises a field isolation region 284 and a dielectric film 286. The field isolation region and dielectric film may be formed from one or more suitable oxidation processes, including LOCOS (local oxidation of silicon) process. In one embodiment, separate oxidation steps may be performed to form the field isolation region and the dielectric film. For example, a first patterned hard mask may be employed to selectively expose regions of the substrate to a first oxidation step, which forms the dielectric film 286 having a first dielectric thickness. A second patterned hard mask may be employed to protect the dielectric film from a second oxidation step, which forms the field isolation region having a second dielectric thickness. Other suitable techniques may also be employed to form the field isolation region and the dielectric film to the desired thicknesses.

In step 512, a conductive field plate is formed on the field isolation region and the dielectric film. In one embodiment, the field plate is formed by a deposition process, including chemical vapor deposition. For example, the deposition process forms a polysilicon layer over the field oxide and dielectric film. A mask and etch process is subsequently employed to pattern the polysilicon layer to form a polysilicon field plate. Other techniques for forming a polysilicon plate may also be useful.

In step 514, cathode contact regions and guard ring contact regions are formed. The contact regions may be formed within the active region by any suitable doping techniques, including ion implantation. For example, a patterned implant mask is employed to selectively implant p-type or n-type dopants into corresponding regions of the active region to form the cathode contact regions and guard ring contact regions.

In step 516, the process continues to form the device as shown in FIGS. 2a-2c and 3a-3d. For example, the process may continue to form the Schottky contact and contact plugs 290. Silicide contacts may also be formed on the cathode contact regions of the active region. The Schottky contact 254 and silicide contacts can be formed by physical vapor deposition (PVD). Other types of contacts that can be formed by other types of processes can also be used. Additional processes may be performed to complete the device. Such processes may include back end of line (BEOL) processing to form interconnects in ILD layers.

After BEOL is completed, the wafer is diced into individual chips, assembled and tested. Other processes may also be included.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor device comprising:
    a substrate having a top surface;
    a device well disposed within the substrate;
    a drift region disposed within the device well;
    a cathode region disposed in the drift region;
    a guard ring region disposed within the device well and adjacent to the drift region;
    a field isolation region disposed on the top surface of the substrate between the cathode region and the guard ring region;
    a dielectric film disposed on the top surface of the substrate and contiguous to a side of the field isolation region, the dielectric film having a top surface, and the dielectric film extending over the drift region and the guard ring region;
    a field plate disposed over the field isolation region, the field plate extending to completely cover the top surface of the dielectric film, and the field plate partially overlapping the guard ring region; and
    a Schottky contact disposed adjacent to the dielectric film, the Schottky contact contacting a portion of the device well to define a Schottky diode interface.

2. The semiconductor device of claim 1 further comprising:
    a low-voltage well in the drift region,
    wherein the cathode region comprises a cathode contact region disposed within the low-voltage well, and the device well, the drift region and the low-voltage well comprise first dopants of a first polarity type.

3. The semiconductor device of claim 2 wherein the guard ring region comprises second dopants of a polarity type opposite to the first polarity type.

4. The semiconductor device of claim 2 wherein the field isolation region extends over the low-voltage well and the drift region.

5. The semiconductor device of claim 2 wherein second polarity type is p-type, and the guard ring region is a segmented guard ring region defined by a plurality of segments of p-type doped regions.

6. The semiconductor device of claim 3 wherein the segments of p-type doped regions are spaced apart and separated by portions of the device well.

7. The semiconductor device of claim 1 wherein the field plate is aligned to an edge of the dielectric film.

8. The semiconductor device of claim 1 wherein the guard ring region extends from the top surface of the substrate to a depth shallower than the drift region.

9. The semiconductor device of claim 1 wherein the guard ring region, the field plate, and the Schottky contact are configured to be coupled with a common potential.

10. The semiconductor device of claim 1 wherein the field plate comprises a doped polysilicon layer.

11. A semiconductor device comprising:
    a substrate having a top surface and an active region defined by a device isolation region;
    a device well disposed within the substrate, the device well encompassing the active region;
    a drift region disposed within the device well;
    a cathode region disposed in the drift region;
    a guard ring region disposed within the device well and adjacent to the drift region;
    a field isolation region disposed on the top surface of the substrate, the field isolation region extending over the drift region;
    a dielectric film disposed on the top surface of the substrate, the dielectric film having a top surface, the dielectric film aligned to the field isolation region, and the dielectric film extending over the guard ring region;
    a field plate disposed over the field isolation region, the field plate extending to completely cover the top surface of the dielectric film, and the field plate partially overlapping the guard ring region; and
    a Schottky contact disposed adjacent to the dielectric film, the Schottky contact contacting a portion of the device well to define a Schottky diode interface,
    wherein the device well, the drift region and the cathode region each include first dopants of a first polarity type, and the guard ring region includes second dopants of a second polarity type opposite to the first polarity type.

12. The semiconductor device of claim 11 further comprising:
    a low-voltage well in the drift region,
    wherein the cathode region comprises a cathode contact region disposed within the low-voltage well, and the drift region surrounds the low-voltage well.

13. The semiconductor device of claim 12 wherein the cathode contact region is disposed between the device isolation region and the field isolation region.

14. The semiconductor device of claim 11 wherein the guard ring region is a segmented guard ring region defined by a plurality of segments of doped regions having the second polarity type.

15. The semiconductor device of claim 14 wherein the segments of doped regions are spaced apart and separated by portions of the device well.

16. The semiconductor device of claim 11 wherein the guard ring region, the field plate, and the Schottky contact are configured to be coupled with a common potential.

17. A method for forming a Schottky diode, the method comprising:
    forming a device well within a substrate;
    forming a drift region within the device well;
    forming a cathode region within the drift region;
    forming a guard ring region within the device well, wherein the guard ring region is positioned adjacent to the drift region;
    forming a field isolation region on a top surface of the substrate, wherein the field isolation region extends over the cathode region and the drift region;
    forming a dielectric film on the top surface of the substrate, wherein the dielectric film is contiguous to a side of the field isolation region and extends over the drift region and the guard ring region;
    forming a field plate over the field isolation region, wherein the field plate completely covers a top surface of the dielectric film and partially overlaps the guard ring region; and
    forming a Schottky contact that is adjacent to the dielectric film and contacts a portion of the device well to define a Schottky diode interface.

18. The method of claim 17 comprising:

forming a low-voltage well within the drift region;

wherein the cathode region is formed within the low-voltage well, and the cathode region and the low-voltage well defines a cathode junction of the Schottky diode.

19. The method of claim 17 wherein forming the guard ring region comprises:

forming a plurality of segments of second polarity type doped regions spaced apart from each other, wherein the segments of second polarity type doped regions are separated by portions of the device well.

20. The method of claim 17 comprising:

forming a plurality of contact plugs over the field plate and the Schottky contact, wherein the contact plugs are configured to couple the field plate and the Schottky contact to a common potential.

\* \* \* \* \*